[12] United States Patent
Wristers et al.

(10) Patent No.: US 7,335,568 B2
(45) Date of Patent: Feb. 26, 2008

(54) METHOD OF FORMING DOPED REGIONS IN THE BULK SUBSTRATE OF AN SOI SUBSTRATE TO CONTROL THE OPERATIONAL CHARACTERISTICS OF TRANSISTORS FORMED THEREABOVE, AND AN INTEGRATED CIRCUIT DEVICE COMPRISING SAME

(75) Inventors: Derick J. Wristers, Bee Caves, TX (US); Andy C. Wei, Dresden (DE); Mark B. Fuselier, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/533,460

(22) Filed: Sep. 20, 2006

(65) Prior Publication Data

US 2007/0015322 A1    Jan. 18, 2007

Related U.S. Application Data

(62) Division of application No. 10/167,184, filed on Jun. 11, 2002, now Pat. No. 7,129,142.

(51) Int. Cl.
    *H01L 21/336*    (2006.01)
(52) U.S. Cl. .............................. 438/305; 257/E21.545; 257/E21.703
(58) Field of Classification Search ........ 438/197–200, 438/223, 224, 228, 232, 233, 279, 299, 298, 438/305, 517; 257/E21.545, E21.703, E21.32
    See application file for complete search history.

(56) References Cited

U.S. PATENT DOCUMENTS

| | | | |
|---|---|---|---|
| 4,996,575 A | 2/1991 | Ipri et al. | 357/23.7 |
| 5,573,962 A | 11/1996 | Sung | 438/217 |
| 5,753,958 A | 5/1998 | Burr et al. | 257/329 |
| 5,869,359 A | 2/1999 | Prabhakar | 438/149 |
| 5,923,067 A | 7/1999 | Voldman | 257/349 |

(Continued)

FOREIGN PATENT DOCUMENTS

| | | |
|---|---|---|
| DE | 44 41 724 A1 | 5/1996 |
| EP | 0 694 977 A2 | 1/1996 |
| EP | 0 749 165 A2 | 12/1996 |
| JP | 09139422 | 5/1997 |
| WO | WO 99/33115 | 7/1999 |

OTHER PUBLICATIONS

Office Action dated Dec. 15, 2003 from U.S. Appl. No. 10/167,184.

(Continued)

*Primary Examiner*—Brook Kebede
(74) *Attorney, Agent, or Firm*—Williams, Morgan & Amerson, P.C.

(57) ABSTRACT

In one illustrative embodiment, the method comprises providing an SOI substrate comprised of an active layer, a buried insulation layer and a bulk substrate, forming a doped region in the bulk substrate under the active layer, forming a plurality of transistors above the SOI substrate in an area above the doped region and applying a voltage to the doped region to vary a threshold voltage of at least one of the plurality of transistors. In another illustrative embodiment, the method comprises providing a consumer product comprised of at least one integrated circuit product, the integrated circuit product being comprised of a plurality of transistors formed in an active layer of an SOI substrate above a doped region formed in a bulk substrate of the SOI substrate, the doped region being formed under the active layer, sensing an activity level of the integrated circuit product and applying a voltage of a magnitude and a polarity to the doped region, the magnitude and polarity of the applied voltage being determined based upon the sensed activity level of the integrated circuit product.

37 Claims, 5 Drawing Sheets

U.S. PATENT DOCUMENTS

| | | | |
|---|---|---|---|
| 6,051,452 A | 4/2000 | Shigyo et al. | 438/151 |
| 6,063,686 A | 5/2000 | Masuda et al. | 438/406 |
| 6,074,920 A | 6/2000 | Houston | 438/289 |
| 6,100,567 A | 8/2000 | Burr | 257/365 |
| 6,172,402 B1 | 1/2001 | Gardner et al. | 257/347 |
| 6,218,703 B1 | 4/2001 | Sano | 257/347 |
| 6,287,901 B1 | 9/2001 | Christensen et al. | 438/162 |
| 6,306,691 B1 | 10/2001 | Koh | 438/149 |
| 6,323,110 B2 | 11/2001 | Ling | 438/459 |
| 6,352,882 B1 * | 3/2002 | Assaderaghi et al. | 438/155 |
| 6,410,394 B1 | 6/2002 | Shao et al. | 438/289 |
| 6,452,232 B1 | 9/2002 | Adan | 257/347 |
| 6,479,862 B1 | 11/2002 | King et al. | 257/321 |
| 6,492,244 B1 | 12/2002 | Christensen et al. | 438/404 |
| 6,538,268 B1 | 3/2003 | Horiuchi | 257/192 |
| 6,555,891 B1 | 4/2003 | Furukawa et al. | 257/505 |
| 6,670,677 B2 * | 12/2003 | Choe et al. | 257/355 |
| 6,774,705 B2 | 8/2004 | Miyazaki et al. | 327/534 |
| 6,875,663 B2 * | 4/2005 | Iwamatsu et al. | 438/298 |
| 2002/0093064 A1 | 7/2002 | Inaba | 257/408 |
| 2002/0105034 A1 | 8/2002 | Iwata et al. | 257/368 |
| 2003/0016075 A1 | 1/2003 | Itoh | 327/534 |
| 2004/0239394 A1 | 12/2004 | Miyazaki | 327/210 |

OTHER PUBLICATIONS

Office Action dated Apr. 21, 2004 from U.S. Appl. No. 10/167,184.
Examiner's Answer dated Jan. 26, 2005 from U.S. Appl. No. 10/167,184.
Supplemental Examiner's Answer dated Sep. 8, 2005 from U.S. Appl. No. 10/167,184.
Supplemental Examiner's Answer dated Nov. 9, 2005 from U.S. Appl. No. 10/167,184.
Decision on Appeal dated May 5, 2006 from U.S. Appl. No. 10/167,184.
Office Action dated Apr. 19, 2005 from U.S. Appl. No. 10/140,441.
Office Action dated Sep. 30, 2005 from U.S. Appl. No. 10/140,441.
Office Action dated Mar. 8, 2006 from U.S. Appl. No. 10/140,441.
Office Action dated Aug. 22, 2006 from U.S. Appl. No. 10/140,441.
Office Action dated Nov. 27, 2006 from U.S. Appl. No. 10/140,441.
Office Action dated May 31, 2007 from U.S. Appl. No. 10/140,441.

* cited by examiner

METHOD OF FORMING DOPED REGIONS IN THE BULK SUBSTRATE OF AN SOI SUBSTRATE TO CONTROL THE OPERATIONAL CHARACTERISTICS OF TRANSISTORS FORMED THEREABOVE, AND AN INTEGRATED CIRCUIT DEVICE COMPRISING SAME

CROSS-REFERENCE TO RELATED APPLICATION

This is a divisional of application Ser. No. 10/167,184, filed Jun. 11, 2002 now U.S. Pat. No. 7,129,142.

BACKGROUND OF THE INVENTION

1. Field of the Invention

This invention relates generally to semiconductor fabrication technology, and, more particularly, to a method of forming doped regions in the bulk substrate of an SOI substrate to control the operational characteristics of transistors formed thereabove, and an integrated circuit device comprising same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

As transistors are continually scaled in keeping with the requirements of advancing technology, device reliability dictates an associated reduction in the power supply voltage. Hence, every successive technology generation is often accompanied by a reduction in the operating voltage of the transistor. It is known that transistor devices fabricated on silicon-on-insulator (SOI) substrates exhibit better performance at low operating voltages than do transistors of similar dimensions fabricated in bulk silicon substrates. The superior performance of SOI devices at low operating voltage is related to the relatively lower junction capacitances obtained on an SOI device as compared to a bulk silicon device of similar dimensions. The buried oxide layer in an SOI device separates active transistor regions from the bulk silicon substrate, thus reducing junction capacitance.

FIG. 1 depicts an example of an illustrative transistor 10 fabricated on an illustrative silicon-on-insulator substrate 11. As shown therein, the SOI substrate 11 is comprised of a bulk substrate 11A, a buried oxide layer 11B, and an active layer 11C. The transistor 10 is comprised of a gate insulation layer 14, a gate electrode 16, sidewall spacers 19, a drain region 18A, and an source region 18B. A plurality of trench isolation regions 17 are formed in the active layer 11C. Also depicted in FIG. 1 are a plurality of conductive contacts 20 formed in a layer of insulating material 21. The conductive contacts 20 provide electrical connection to the drain and source regions 18A, 18B. As constructed, the transistor 10 defines a channel region 12 in the active layer 11C beneath the gate insulation layer 14. The bulk substrate 11A is normally doped with an appropriate dopant material, i.e., a P-type dopant such as boron or boron difluoride for NMOS devices, or an N-type dopant such as arsenic or phosphorous for PMOS devices. Typically, the bulk substrate 11A will have a doping concentration level on the order of approximately $10^{15}$ ions/cm$^3$. The buried oxide layer 11B may be comprised of silicon dioxide, and it may have a thickness of approximately 50-360 nm (500-3600 Å). The active layer 11C may be comprised of a doped silicon, and it may have a thickness of approximately 5-30 nm (50-300 Å).

Transistors fabricated in SOI substrates offer several performance advantages over transistors fabricated in bulk silicon substrates. For example, complementary-metal-oxide-semiconductor (CMOS) devices fabricated in SOI substrates are less prone to disabling capacitive coupling, known as latch-up. In addition, transistors fabricated in SOI substrates, in general, have large drive currents and high transconductance values. Also, the sub-micron SOI transistors have improved immunity to short-channel effects when compared with bulk transistors fabricated to similar dimensions.

Although SOI devices offer performance advantages over bulk silicon devices of similar dimensions, SOI devices share certain performance problems common to all thin-film transistors. For example, the active elements of an SOI transistor are fabricated in the thin-film active layer 11C. Scaling of thin-film transistors to smaller dimensions requires that the thickness of the active layer 11C be reduced. However, as the thickness of the active layer 11C is reduced, the electrical resistance of the active layer 11C correspondingly increases. This can have a negative impact on transistor performance because the fabrication of transistor elements in a conductive body having a high electrical resistance reduces the drive current of the transistor 10. Moreover, as the thickness of the active layer 11C of an SOI device continues to decrease, variations in the threshold voltage ($V_T$) of the device occur. In short, as the thickness of the active layer 11C decreases, the threshold voltage of the device becomes unstable. As a result, use of such unstable devices in modern integrated circuit devices, e.g., microprocessors, memory devices, logic devices, etc., becomes very difficult if not impossible.

Additionally, off-state leakage currents are always of concern in integrated circuit design, since such currents tend to, among other things, increase power consumption. Such increased power consumption is particularly undesirable in many modern portable consumer devices employing integrated circuits, e.g., portable computers. Lastly, as device dimensions continue to decrease in fully depleted SOI structures, increased short channel effects may occur. That is, in such fully depleted devices, at least some of the field lines of the electric field of the drain 18A tend to couple to the channel region 12 of the transistor 10 through the relatively thick (200-360 nm) buried oxide layer 11B. In some cases, the electric field of the drain 18A may act to, in effect, turn on the transistor 10. Theoretically, such problems may be reduced by reducing the thickness of the buried oxide layer 11B and/or increasing the doping concentration of the bulk substrate 11A. However, such actions, if taken, would tend to increase the junction capacitance between the drain and source regions 18A, 18B and the bulk substrate 11A, thereby negating one of the primary benefits of SOI technology, i.e., reducing such junction capacitance.

Additionally, the threshold voltage ($V_T$) of a transistor is a very important parameter. As a general statement, the threshold voltage is a significant factor as it relates to the operational speed of the transistor and integrated circuit products incorporating such transistors, as well as leakage current and power consumption in such transistors or products. Moreover, the importance of these electrical parameters, e.g., operating speed, leakage current, power consumption, etc., may vary depending upon the nature and requirements of the ultimate consumer product. For example, in mobile computing or telecommunication applications, power consumption is a very important consideration. Thus, at least in some cases, transistors exhibiting higher threshold voltage levels may be desirable for mobile computing and telecommunications applications. In contrast, in very high performance applications, e.g., high-end servers, operating speed may be the most desirable operational characteristic of the integrated circuit product. Thus, in those situations, it may be desirable to make the integrated circuit product with transistors having a relatively low threshold voltage. Existing design techniques try to balance these computing concerns by selecting design parameters such that the resulting transistors and integrated circuit device exhibit performance characteristics that are at least acceptable in terms of such competing interest, even though such performance characteristics may not be ideal for each situation. Alternatively, efforts are made to revise product designs, hopefully on a small scale, to accommodate those competing interests. For example, if an integrated circuit manufacturer receives an order for a number of parts destined for mobile computing and/or telecommunication activities, then the manufacturer may make product modifications in an effort to reduce power consumption, even if it means somewhat of a reduction in operational speed.

The present invention is directed to a device and various methods that may solve, or at least reduce, some or all of the aforementioned problems.

SUMMARY OF THE INVENTION

The present invention is generally directed to various methods of forming doped regions in the bulk substrate of an SOI substrate to control the operational characteristics of transistors formed thereabove, and an integrated circuit device comprising same. In one illustrative embodiment, the method comprises providing an SOI substrate comprised of an active layer, a buried insulation layer and a bulk substrate, forming a doped region in the bulk substrate under the active layer, forming a plurality of transistors above the SOI substrate in an area above the doped region and forming a contact to the doped region. In further embodiments, the method comprises applying a voltage to the doped region to vary a threshold voltage of at least one of the plurality of transistors.

In another illustrative embodiment, the method comprises providing a consumer product comprised of at least one integrated circuit product, the integrated circuit product being comprised of a plurality of transistors formed in an active layer of an SOI substrate above a doped region formed in a bulk substrate of the SOI substrate, the doped region being formed under the active layer, sensing an activity level of the integrated circuit product and applying a voltage of a magnitude and a polarity to the doped region, the magnitude and polarity of the applied voltage being determined based upon the sensed activity level of the integrated circuit product.

BRIEF DESCRIPTION OF THE DRAWINGS

The invention may be understood by reference to the following description taken in conjunction with the accompanying drawings, in which like reference numerals identify like elements, and in which.

Figure 1:
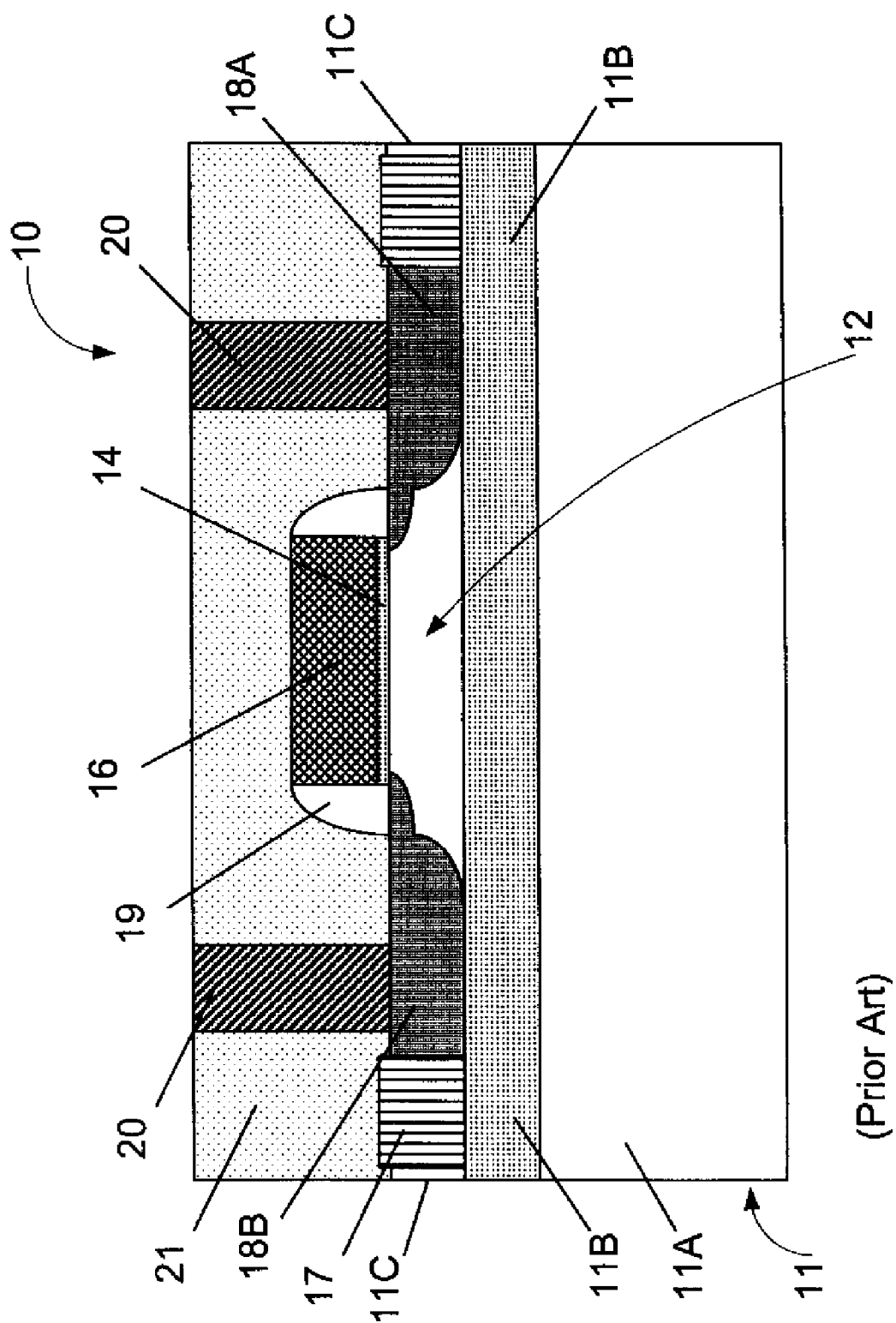
FIG. 1 is a cross-sectional view of an illustrative prior art semiconductor device formed above an SOI substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of forming doped regions in the bulk substrate of an SOI substrate to control the operational characteristics of transistors formed thereabove, and an integrated circuit device comprising same. After a complete reading of the present application that the present invention, those skilled in the art will recognize that the present invention may be employed with respect to a variety of technologies, e.g., NMOS, PMOS, CMOS, etc., and it may be employed with a variety of different type devices, e.g., memory devices, microprocessors, logic devices, etc. Moreover, it may be employed in the context of integrated circuit devices that may be used in a variety of consumer products, such as a personal computer, a portable computer, a mobile telephone, a digital camera, a personal digital assistant and a wireless internet appliance. Thus, the present invention should not be considered as limited to any particular type of integrated circuit device, technology or consumer product unless such limitations are clearly set forth in the appended claims.

Figure 2:
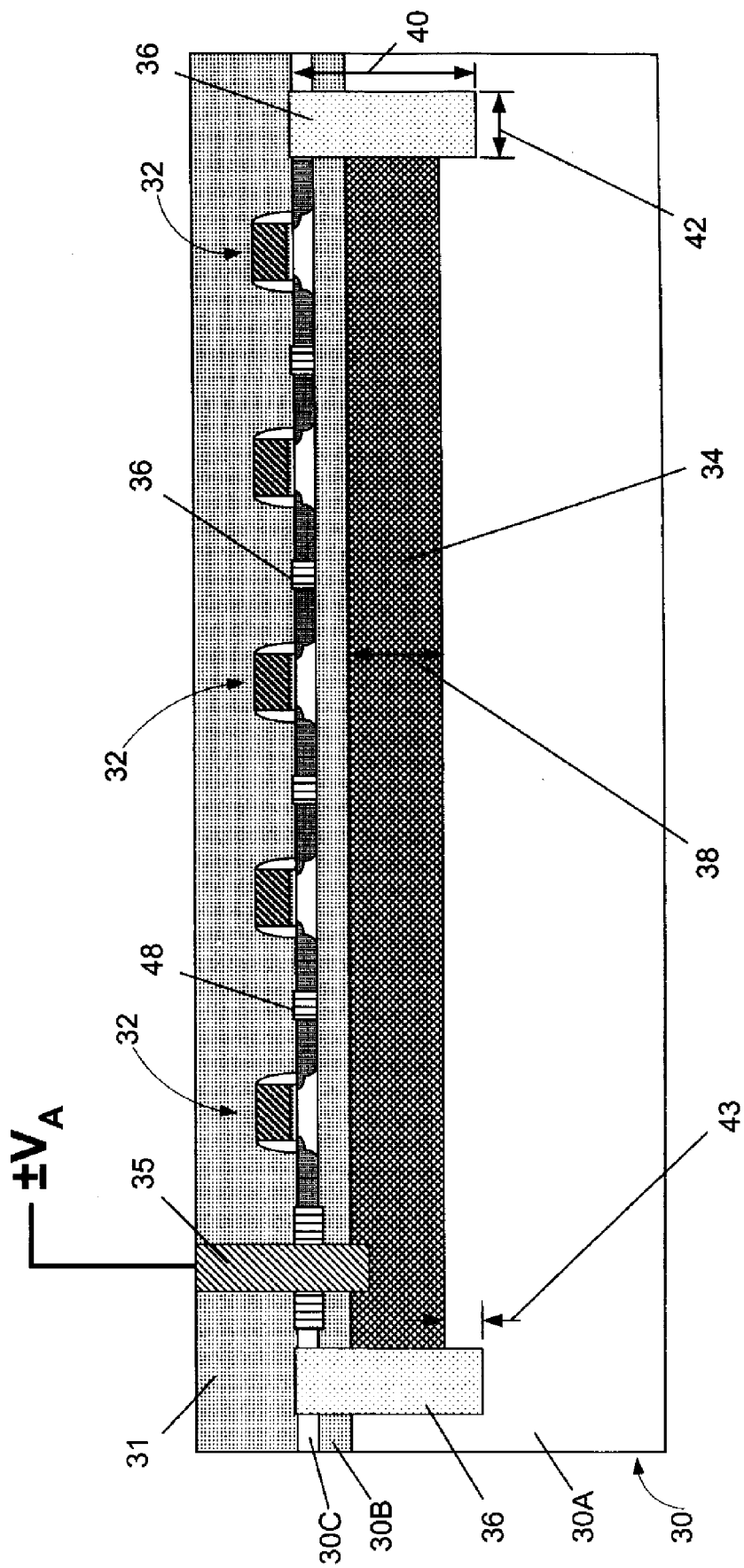
FIG. 2 is a cross-sectional view depicting one illustrative embodiment of the present invention wherein a doped region is formed in the bulk substrate of an SOI substrate.

As shown in FIG. 2, a plurality of schematically depicted transistors 32 are formed above an SOI substrate 30. In one illustrative embodiment, the SOI substrate 30 is comprised of a bulk substrate 30A, a buried insulation layer 30B, and an active layer 30C. Of course, FIG. 2 only depicts a small portion of an entire substrate or wafer. The bulk substrate 30A may be doped with a P-type dopant material, e.g., boron, boron difluoride, etc., and it my have a dopant concentration of approximately $10^{15}$ ions/cm$^3$. The buried insulation layer 30B may have a thickness that, in one embodiment, varies from approximately 5-50 nm (50-500 Å) or larger, and it may be comprised of, for example, silicon dioxide. However, the recited details of the construction of the SOI substrate 30 should not be considered a limitation of the present invention unless such limitations are specifically set forth in the appended claims.

The active layer 30C may have a thickness that varies from approximately 5-30 nm (50-300 Å), and, in the case of an NMOS device, it may be doped with a P-type dopant material at a concentration level of approximately $10^{17}$ ions/cm$^3$. In practice, the SOI substrate 30 may be provided to a semiconductor manufacturer wherein the active layer 30C is doped with a nominal level of dopant material, e.g., approximately $10^{15}$ ions/cm$^3$ of the appropriate dopant material, i.e., P-type or N-type dopant material. Thereafter, the integrated circuit manufacturer, using appropriate masking techniques, may perform one or more ion implant processes to increase the dopant concentration of the active layer 30C to approximately $10^{17}$ ions/cm$^3$ of the appropriate dopant material, e.g., N-type or P-type, in various desired areas of the active layer 30C, using appropriate masking layers (not shown) when needed. As those skilled in the art will recognize, different type transistors, i.e., NMOS and PMOS transistors, will be formed in and above the active layer 30C having localized regions doped with P-type and N-type dopant material, respectively.

The transistors 32 schematically depicted in FIG. 2 may be comprised of a gate insulation layer, a gate electrode, sidewall spacers and source/drain regions, all of which may be formed using known techniques and materials. Thus, the transistors 32 described herein may be of any type commonly found in modern integrated circuit devices.

According to one illustrative embodiment of the present invention, a doped region 34 is formed in the bulk substrate 30A and a plurality of transistors 32 are formed in the active layer 30C above the doped region 34. More particularly, as shown in FIG. 2, the doped region 34 is isolated by isolation regions 36. In the depicted embodiment, the isolation regions 36 are trench isolation regions that may have a depth 40 of approximately 200-500 nm and a width 42 of approximately 100-300 nm. The doped region 34 may have a depth 38 of approximately 80-100 nm, and it may be formed by an ion implant process to be described in greater detail below. A contact 35 is provided to bias the doped region 34 in the manner to be described below so as to improve one or more operating characteristics of the transistors 32 formed above the doped region 34.

Typically, a wafer or substrate 30 may be comprised of many die. The number of die per wafer depends upon the type of product under construction. For a typical 8-inch wafer, there may be hundreds of die formed above the substrate 30. The die represent the area of the substrate 30 where production integrated circuit devices will be formed. Ultimately, after device processing is complete, the die will be separately tested, packaged and sold as a complete integrated circuit device, e.g., a microprocessor, an application-specific circuit, a logic device, etc.

Figure 3:
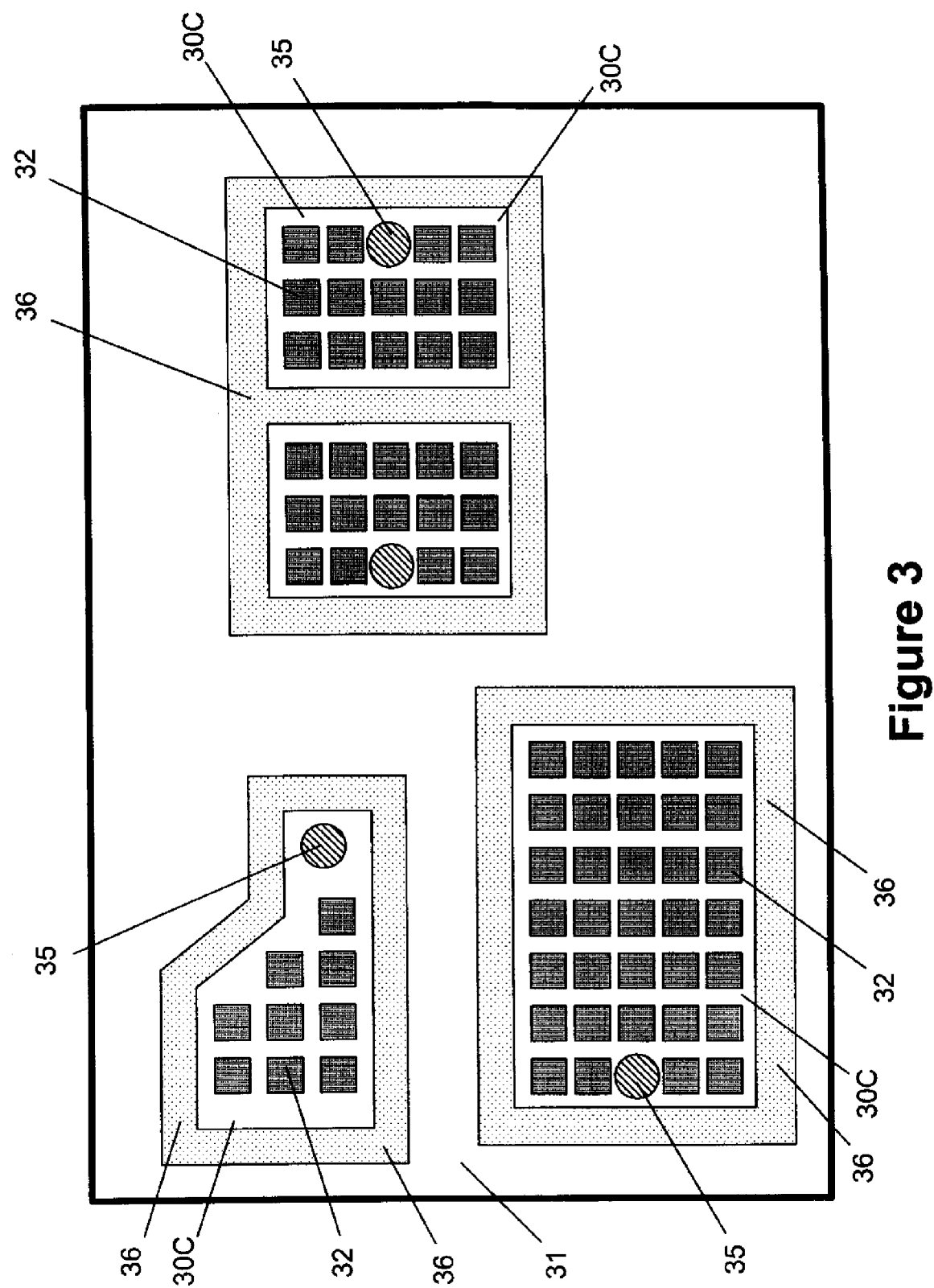
FIG. 3 is a plan view of an illustrative die having multiple doped regions formed therein.

FIG. 3 is a plan view of an illustrative die 31 having a plurality of doped regions 34 formed therein in accordance with one embodiment of the present invention. The die 31 or integrated circuit product may comprise one or more of the doped regions 34, each of which have a plurality of transistors 32 (schematically depicted as blocks) formed thereabove. Since FIG. 3 is a plan view, the doped regions 34 are not depicted in FIG. 3, as they are positioned under the active layer 30C regions shown in FIG. 3, and defined by the isolation regions 36. Also depicted in FIG. 3 are contacts 35 which may be used to establish electrical connection with the underlying doped regions 34. Of course, the number, size, configuration and location of the contacts 35 may vary, e.g., multiple contacts 35 may be provided to each doped region 34, the contacts 35 may be positioned near the middle of the doped region 34, etc. As indicated in FIG. 3, the doped regions 34 may be formed in any configuration, e.g., square, rectangular, circular, irregular shapes, etc.

The doped regions 34 depicted in FIG. 2 may be doped with an N-type or P-type dopant material depending upon the particular device or section of device under consideration. For example, in one illustrative embodiment, the doped region 34 is doped with an N-type dopant material, e.g., arsenic or phosphorous, and all of the transistors 32 formed above the doped region 34 are PMOS transistors. In another embodiment, the doped region 34 is doped with a P-type dopant material, such as boron or boron difluoride, and all of the transistors 32 formed above the doped region 34 are NMOS transistors. However, as will be recognized by those skilled in the art after a complete reading of the present application, the present invention may also be employed in cases where the plurality of transistors 32 formed above the doped region 34 are comprised of both NMOS and PMOS transistors, irrespective of the type of dopant material used to form the doped regions 34.

Figure 4:
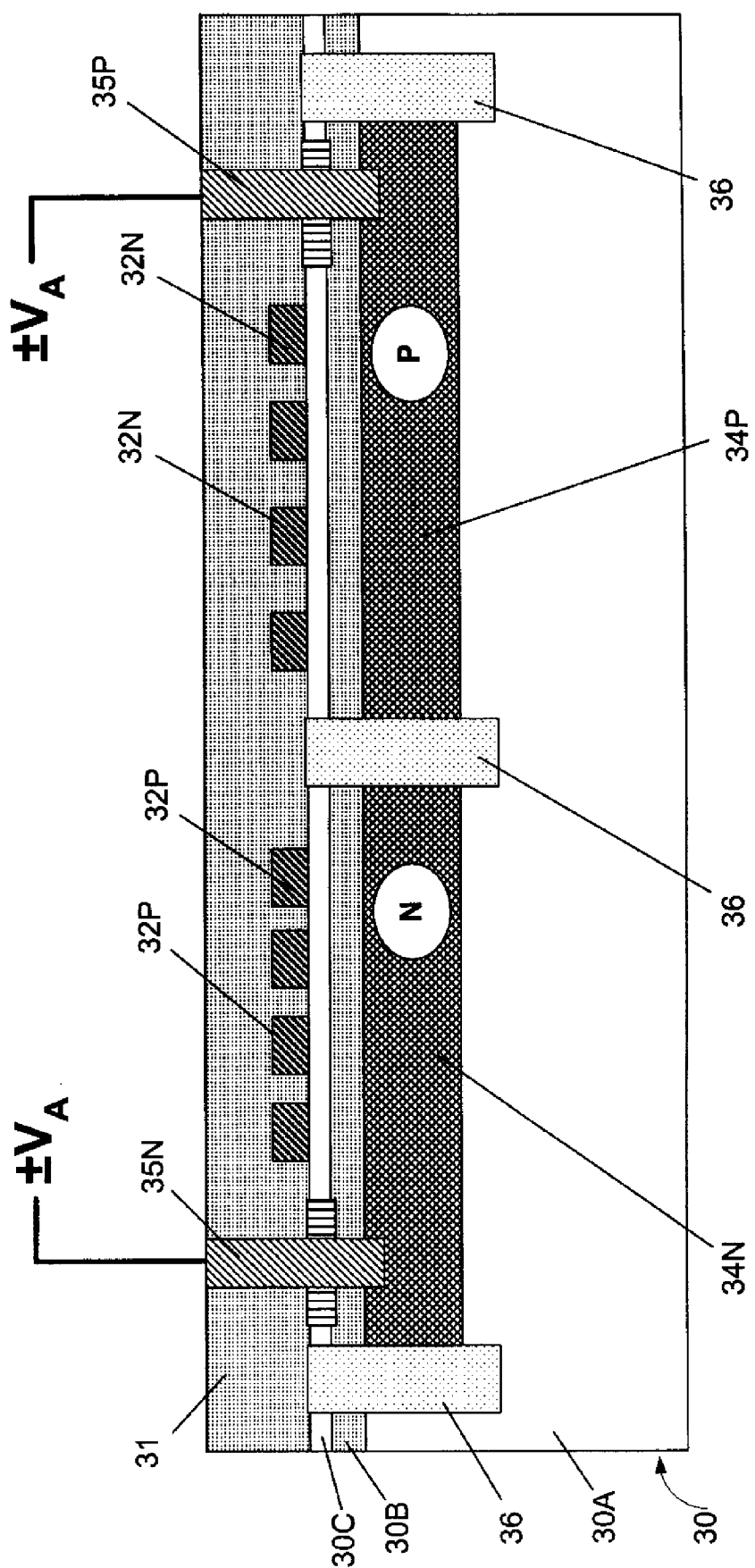
FIG. 4 is a cross-sectional view of another illustrative embodiment of the present invention wherein multiple doped regions are formed in the bulk substrate of an SOI substrate.

Moreover, all of the doped regions 34 formed in the die 31 need not be formed of the same type of dopant material. That is, a die 31 may have one or more doped regions 34 doped with an N-type dopant material and one or more doped regions 34 doped with a P-type dopant material. FIG. 4 depicts an illustrative example wherein an N-doped region 34N is formed in the bulk substrate 30A adjacent a P-doped region 34P. The doped regions 34N, 34P are electrically isolated from one another, and from the surrounding structure by the isolation region 36. Separate contacts 35N, 35P are provided to contact the doped regions 34N, 34P, respectively, for reasons to be described more fully below. In one illustrative embodiment, each of the plurality of transistors 32P formed above the doped region 34N are PMOS transistors, and each of the transistors 32N formed above the doped region 34P are NMOS transistors. Of course, as stated previously, in some embodiments of the present invention transistors of both types, i.e., NMOS and PMOS, may be formed above each of the doped regions 34N and 34P. The number of transistors formed above each of the doped regions 34 will vary depending on the product under construction and the desired impact on the operational characteristics of the completed integrated circuit device.

The doped regions 34 described above may be formed by a variety of techniques using a variety of process flows. The doped regions 34 may be formed by performing an ion implant process at a dopant dose that ranges from approximately $1e^{14}$-$1e^{16}$ ions/cm$^2$ to result in the doped regions 34 having a dopant concentration of approximately $10e^{18}$-$10e^{20}$ ions/cm$^3$. The implant energy of the ion implant process will vary depending upon the species of dopant implanted. For example, for N-type dopant materials, e.g., arsenic, the implant energy may range from approximately 100-300 keV. For P-type dopant materials, e.g., boron, the implant energy may range from approximately 30-100 keV. Moreover, if desired, the dopant concentration level (ions/cm$^3$) of the doped regions 34 may vary, i.e., multiple doped regions 34 may have different dopant concentration levels.

The trench isolation regions 36 may be formed by a variety of known techniques. For example, one or more anisotropic etching processes may be performed to form an initial trench through the active layer 30C, the buried insulation layer 30B and into the bulk substrate 30A. Thereafter, the trench may be filled with an appropriate insulating material, such as silicon dioxide. In one illustrative embodiment, the isolation structure 36 may extend beyond the depth 38 of the doped region 34 by a distance 43 (see FIG. 2) of approximately 20-100 nm. The contacts 35 may be formed using any of a variety of known methods and materials for forming contacts to various structures in integrated circuit devices. For example, the contacts 35 may be comprised of a metal, such as tungsten.

The process flow used to form the doped regions 34 and isolation regions 36 may vary depending upon the device under construction. For example, if it is determined that only N-type doped regions 34 are to be formed in the bulk substrate 30A, then a blanket ion implant process may be performed to form an N-doped region across the entirety of the bulk substrate 30A. Thereafter, the specific doped regions 34 may be defined by forming the isolation regions 36 in the desired areas of each of the individual die 31. That is, since only N-type doped regions 34 are being formed, the entire bulk substrate 30A may be implanted with N-type dopant material, and the isolation regions 36 may be used to define the doped regions 34. Alternatively, if desired, the isolation regions 36 may be formed prior to performing the blanket ion implant across the entirety of the substrate 30. After the doped regions 34 and transistors 32 are formed, the contacts 35 may be formed to provide electrical connection to the doped regions 34 defined in the bulk substrate 30A. A similar process flow may be employed in the case where only P-type doped regions 34 are to be formed in the bulk substrate 30A.

In cases where there are to be both N-type and P-type doped regions 34 formed at various locations across a die 31 or substrate 30, various masking layers (not shown) may be used to shield the appropriate areas from the N-type or P-type ion implant step as the case may be. As with the case before, the isolation regions 36 may be formed before or after the implant steps are performed. Additionally, the doped regions 34 may be formed by implanting ions through the buried insulation layer 30B, or they may be formed by implanting ions into the bulk substrate 30A prior to the formation of the buried insulation layer 30B.

The present invention may be used to dynamically control the operational characteristics of at least some aspects of an integrated circuit device. For example, a modern microprocessor may be comprised of approximately 30 million transistors. However, at any given time, at least in some cases, only one million or less of such transistors may be operating, i.e., switching on and off. Thus, it may be important to enhance the operating frequency or switching speed of the active transistors. At the same time, it may be desirable to reduce the leakage current of the inactive transistors. This may be accomplished by segregating the various transistors and using the methods and structures disclosed herein.

For example, in one illustrative embodiment where the doped region 34 depicted in FIG. 2 is doped with an N-type dopant material and the transistors 32 are PMOS transistors, applying a positive voltage ($+V_A$) to the N-doped region 34 will tend to increase the threshold voltage ($V_T$) of the PMOS transistors 32. In turn, this will tend to reduce the leakage currents for the PMOS devices. Such controllability may be very important where, for at least certain periods of time, a number of PMOS transistors of the integrated circuit device are inactive. Of course, as will be understood by those skilled in the art after a complete reading of the present application, the positive voltage ($+V_A$) applied to the N-doped region 34 is positive with respect to the drain voltage ($V_{dd}$).

On the other hand, applying a negative voltage ($-V_A$) to the N-doped region 34 will tend to reduce the threshold voltage ($V_T$) of the PMOS transistors 32 formed above the N-doped region 34. In turn, this will tend to increase the switching frequency of the PMOS transistors 32. Control of this type may be desirable where a number of PMOS transistors are active or part of a critical path with respect to the ultimate performance level of the completed integrated circuit device.

In the case where the doped region 34 depicted in FIG. 2 is doped with a P-type dopant material and where the transistors 32 are NMOS transistors, applying a positive voltage ($+V_A$) will tend to reduce the threshold voltage ($V_T$) of the NMOS transistors. As a result, the NMOS transistors 32 will tend to exhibit faster switching speeds. Applying a negative voltage ($-V_A$) to the P-doped region 34 will tend to increase the threshold voltage ($V_T$) of the NMOS transistors 32 formed above the P-doped region 34. In turn, this will tend to reduce the off-state leakage currents of the NMOS transistors 32.

In one illustrative embodiment, only PMOS type transistors are formed above N-doped regions 34, and only NMOS devices are formed above P-doped regions 34. Electrical circuits that contain both PMOS and NMOS devices may still be formed by appropriate wiring connections (not shown). However, in some cases, both NMOS and PMOS devices may be formed above a single doped region 34. For example, it may be the case that the majority of transistors 32 formed above a P-doped region 34 are NMOS devices, while the remaining devices are PMOS devices. In that case, the applied voltage ($\pm V_A$) may be applied to the P-doped region 34 to control the NMOS transistors 32 formed thereabove in the manner described above. It is believed that a positive voltage ($+V_A$) applied to the doped region 34 will also tend to increase the threshold voltage ($V_T$) of the PMOS devices formed above the P-doped region 34, and that a negative applied voltage ($-V_A$) will tend to decrease the threshold voltage ($V_T$) of the PMOS devices. However, it also believed that any operational benefit that may be achieved with respect to the PMOS transistors formed above the P-doped region 34 will be somewhat offset by an increase in the work function of the PMOS transistors due to the applied voltage ($\pm V_A$). Similar reasoning applies with respect to NMOS devices formed above an N-doped region 34.

The magnitude and polarity of the applied voltage ($V_A$) may vary depending upon the particular device. In general, the applied voltage ($V_A$) for the devices may be a voltage that falls within a range, inclusively, of plus or minus the drain voltage of the device, i.e., $\pm V_{dd}$. As a more specific example, wherein $V_{dd}$=1.2 V, the positive applied voltage ($+V_A$) may range from approximately +0.6-+0.08 volts, whereas the negative applied voltage ($-V_A$) may range from approximately −0.6--0.8 volts. Additionally, the magnitude of applied voltage ($V_A$) may vary depending on the type of device at issue, i.e., NMOS, PMOS. However, it should be understood that these illustrative voltage levels are representative in nature, and they should not be considered a limitation of the present invention unless such limitations are expressly set forth in the appended claims.

Through use of the present invention, the threshold voltage ($V_T$) of various transistors 32 of an integrated circuit product may be dynamically controlled by applying a voltage ($\pm V_A$) to one or more doped regions 34 formed in the integrated circuit product, thereby allowing control of the electrical characteristics of the integrated circuit product. That ability is desirable in many respects. For example, in some product applications, low leakage currents and power consumption is of paramount importance, e.g., mobile computing and telecommunication applications. In those situations, the threshold voltage ($V_T$) of some or all of the various transistors that are part of the completed integrated circuit product, e.g., microprocessor, digital signal processor, ASICs, etc., used to make the ultimate consumer product may be increased or set at a relatively high value to thereby reduce such leakage currents and unwanted power consumption. Conversely, in applications where operating performance is of greatest concern, e.g., high-end servers, workstations, desktop computers, etc., the threshold voltage ($V_T$) of some or all of the transistors 32 that comprise the resulting integrated circuit product may be reduced or set at a relatively low level to thereby increase the operating frequency or speed of the particular integrated circuit product.

In one illustrative embodiment, the applied voltage ($\pm V_A$) to be applied to one or more doped regions 34 may be determined by a manufacturer based upon the desired operating characteristics of the ultimate consumer product. For example, an original equipment manufacturer (OEM) may be provided with an integrated circuit product, e.g., a microprocessor, a digital signal processor, an application-specific integrated circuit, a memory array, etc., to be included in a consumer product, e.g., a high-end server, a mobile telephone, a portable computer, etc. Based upon the desired performance characteristics of the ultimate consumer product, e.g., the portable computer, the OEM may fuse together certain elements of the integrated circuit product such that it tends to exhibit the desired characteristics. For example, in the case where a digital signal processor (DSP) may be earmarked for a mobile telephone application, the OEM may fuse or wire the DSP such that the desired voltage ($\pm V_A$) is applied to the desired doped regions 34 to thereby cause some or all of the transistors 32 comprising the DSP to exhibit low leakage currents and low power consumption. As yet another example, an OEM of high-performance servers may fuse or wire a microprocessor such that the desired voltage ($\pm V_A$) is applied to the desired doped regions 34 to cause some or all of the transistors 32 of one or more microprocessors or ASICs within the server to exhibit very high operating speed characteristics. Such capability provides an OEM with greater flexibility in providing consumer products that exhibit the desired electrical characteristics, and it provides the OEM with greater flexibility for adapting to changes in consumer demands with respect to various types of products. The physical steps used to fuse or wire the integrated circuit product such that the appropriate voltage ($V_A$) may be applied to the appropriate doped regions 34 within an integrated circuit product are well known to those skilled in the art.

In another illustrative embodiment, the present invention is directed to an integrated circuit product wherein the threshold voltage ($V_T$) of some or all of the transistors that comprise the integrated circuit product, e.g., microprocessor, DSP, etc., may be controlled or varied based upon the current operating condition of the integrated circuit product and/or the ultimate consumer device. That is, the voltage ($\pm V_A$) applied to one or more of the doped regions 34 within an integrated circuit product may be varied or controlled based upon the current operating conditions of the integrated circuit product and/or the ultimate consumer device. For example, in the case of a portable computer, when the computer is essentially idle, a voltage ($\pm V_A$) may be applied to some or all of the doped regions 34 to increase the threshold voltage ($V_T$) of the transistors 32 (NMOS and/or PMOS devices) formed above various doped regions 34 within an integrated circuit product, e.g., microprocessor, such that the leakage current and power consumption of the integrated circuit product is reduced, thereby conserving battery resources. Alternatively, when an application program is actually being used on the portable computer, at least above some preselected level of activity, the applied voltage ($\pm V_A$) to some or all of the doped regions 34 of the integrated circuit product may be changed such that the threshold voltage ($V_T$) of some or all of the transistors 32 formed above the doped regions 34 may be decreased, thereby tending to increase the operating frequency of the integrated circuit product and the speed of the ultimate consumer device. In short, in this embodiment, a product may be provided with a mode selection capability wherein the desired electrical performance characteristics of the ultimate consumer device and of integrated circuit products within the ultimate consumer device may be varied depending upon real-time or near real-time operating characteristics of the ultimate consumer device, e.g., portable computer, high-end server, desktop computer, mobile telephone, etc.

Further detailed control algorithms may be employed in this context also. For example, in the case described above for a portable computer, the applied voltage ($\pm V_A$) was adjusted so as to increase the speed of the portable computer when it was sensed or determined that an application program, e.g., Microsoft Word®, was running. However, in some situations, it may be desirable to avoid selecting the "high-performance" mode of operation. For example, a control algorithm may be established wherein if the power remaining in the batteries of the portable computer gets too low, then the portable computer cannot be configured to the "high-performance" mode.

Figure 5:
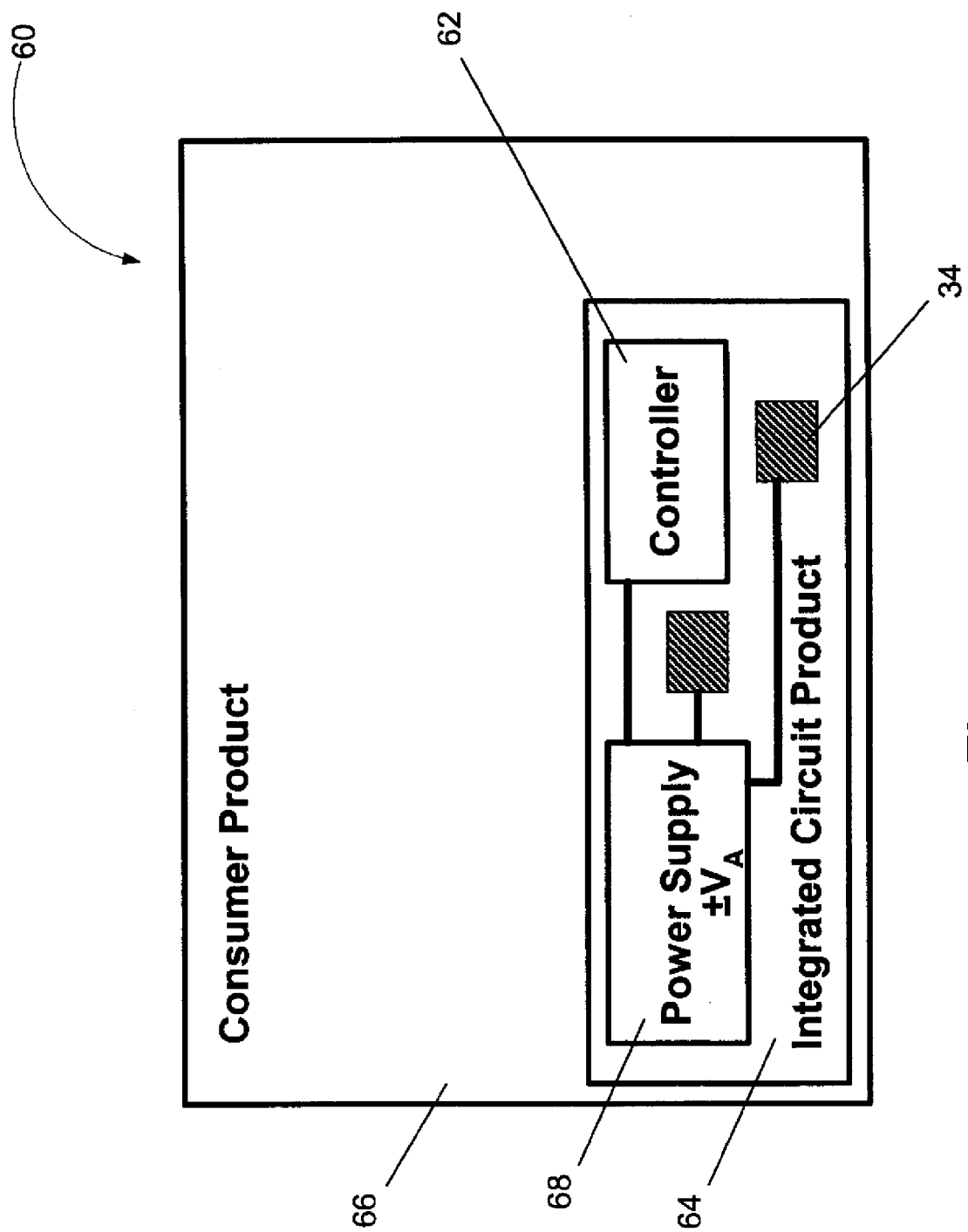
FIG. 5 is a schematic depiction of an illustrative consumer product in which the present invention may be employed.

FIG. 5 is a schematic, block diagram depiction of an illustrative system 60 in which the present invention may be employed. As shown therein, the system 60 is comprised of a controller 62 that is operatively coupled to an integrated circuit product 64 that is part of a completed consumer product 66. A plurality of doped regions 34 are also schematically depicted in FIG. 5. The integrated circuit product 64 is intended to be representative of any of a vast variety of integrated circuit products, e.g., a microprocessor, a DSP, an ASIC, a memory array, a logic device, etc. Thus, the particular type of integrated circuit product 64 should not be considered a limitation of the present invention unless such a limitation is clearly set forth in the appended claims. Additionally, although a single integrated circuit product 64 is depicted in FIG. 5, it is to be understood that it is representative of one or more such integrated circuit products 64 that may be present within the consumer product 66.

It should also be understood that the consumer product 66 depicted in FIG. 5 is representative of any type of product that may employ integrated circuit products 64, e.g., personal computers, servers, mobile telephones, portable computers, digital cameras, etc. Thus, the particular type of consumer product used with the present invention should not be considered a limitation unless such limitations are clearly set forth in the appended claims.

In general, the controller 62 is adapted to sense, or be provided with, the operational activity of the integrated circuit product 64 within the consumer product 66. Based upon the sensed or detected level of activity of the integrated circuit product 64, the controller 62 may supply the appropriate voltage ($\pm V_A$) from the power supply 68 to one or more of the doped regions 34 formed on the integrated circuit product 64 to adjust the electrical performance characteristics, i.e., performance mode, of the integrated circuit product 64 to a performance level that best fits the sensed activity level of the integrated circuit product 64. For example, in the illustrative case when the integrated circuit product 64 is a microprocessor, the controller 62 may sense (or be provided with) the number of times the microprocessor is accessed, or required to execute an instruction, over a given time period. Based upon various control rules (that may vary depending upon the particular integrated circuit product and the particular application in which it is used), the controller 62 may switch the integrated circuit product 64 to a "high performance" mode of operation if the sensed access rate exceeds a preselected limit. To accomplish this, the controller 62 may execute instructions that direct the appropriate applied voltage ($\pm V_A$) be applied to at least one of the doped regions 34 within the integrated circuit product 64. If the access rate of the microprocessor falls below a certain preselected limit, the controller 62 may adjust the voltage ($\pm V_A$) applied to one or more of the doped regions 34 such that the integrated circuit product 64 goes into a "power saving" mode.

The actions taken by the controller 62 may be accomplished with hardware or software or a combination of both. In the illustrated embodiments, the controller 62 is a collection of logic circuitry that is capable of processing the appropriate software to implement the functions described herein. That is, the controller 62 is capable of detecting the desired mode of operation (based upon a predetermined, programmed algorithm) and adjusting the applied bias ($\pm V_A$) to the doped regions 34 to achieve the desired mode of operation. In the depicted embodiment, the controller 62 is shown as part of the integrated circuit product 64. However, other embodiments are also possible. For example, the controller 62 may be part of a separate integrated circuit product (not shown), i.e., a controller chip-set or the like, within the consumer product 66. Similarly, the power supply 68 is depicted as part of the integrated circuit product 64. However, those skilled in the art recognize that the power supply 68 could be from an external source or generator.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The present invention is directed to an SOI substrate 30 having a plurality of transistors 32 formed above the substrate 30 and a means for varying or controlling the threshold voltage of at least some of a plurality of transistors 32 formed above the doped region 34. In the disclosed embodiment, the means for controlling the threshold voltage of the transistors 32 comprises the doped region 34 and the contact 35.

The present invention is generally directed to various methods of forming doped regions in the bulk substrate of an SOI substrate to control the operational characteristics of transistors formed thereabove, and an integrated circuit device comprising same. In one illustrative embodiment, the method comprises providing an SOI substrate comprised of an active layer, a buried insulation layer and a bulk substrate, forming a doped region in the bulk substrate under the active layer, forming a plurality of transistors above the SOI substrate in an area above the doped region and forming a contact to the doped region. In further embodiments, the method may comprise applying a voltage to the doped region to vary a threshold voltage of at least one of the plurality of transistors. In another illustrative embodiment, a plurality of the doped regions 34 are formed in the bulk substrate 30A in an area defined by a single production die, and a plurality of transistors 32 are formed above each of the doped regions 34. As described herein, various voltages may be applied to one or more of the doped regions 34 to vary the operational characteristics of one or more of the transistors 32 formed above the doped regions 34.

In another illustrative embodiment, the method comprises providing a consumer product comprised of at least one integrated circuit product, the integrated circuit product being comprised of a plurality of transistors formed in an active layer of an SOI substrate above a doped region formed in a bulk substrate of the SOI substrate, the doped region being formed under the active layer, sensing an activity level of the integrated circuit product and applying a voltage of a magnitude and a polarity to the doped region, the magnitude and polarity of the applied voltage being determined based upon the sensed activity level of the integrated circuit product.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a consumer product comprised of at least one integrated circuit product, said integrated circuit product being comprised of a plurality of transistors formed in an active layer of an SOI substrate above a doped region formed in a bulk substrate of said SOI substrate and a contact to said doped region, said doped region being formed under said active layer;
sensing an operational activity level of said integrated circuit product; and
applying a voltage of a magnitude and a polarity to said doped region via said contact, said magnitude and polarity of said applied voltage being determined based upon said sensed operational activity level of said integrated circuit product.

2. The method of claim 1, wherein said consumer product comprises one of a personal computer, a portable computer, a mobile telephone, a digital camera, a personal digital assistant or a wireless internet appliance.

3. The method of claim 1, wherein said integrated circuit product one of a microprocessor, a digital signal process, an application-specific integrated circuit product, a memory array or a logic device.

4. The method of claim 1, wherein sensing an operational activity level of said integrated circuit product comprises sensing a rate at which said integrated circuit product is performing its intended functions.

5. The method of claim 1, wherein applying a voltage of a magnitude and a polarity to said doped region via said contact, said magnitude and polarity of said applied voltage being determined based upon said sensed activity level of said integrated circuit product, comprises applying a voltage of a magnitude and a polarity to said doped region via said contact to vary a threshold voltage of at least one of said plurality of transistors formed above said doped region, said magnitude and polarity of said applied voltage being determined based upon said sensed activity level of said integrated circuit product.

6. The method of claim 1, wherein said plurality of transistors are comprised of at least one NMOS transistor and at least one PMOS transistor.

7. The method of claim 1, wherein said plurality of transistors are comprised of at least one NMOS transistor and at least one PMOS transistor, wherein said doped region is doped with an N-type dopant material.

8. The method of claim 1, wherein said plurality of transistors are comprised of at least one NMOS transistor and at least one PMOS transistor, wherein said doped region is doped with a P-type dopant material.

9. The method of claim 1, wherein said doped region is doped with a P-type dopant material and a majority of said plurality of transistors are NMOS transistors.

10. The method of claim 1, wherein said doped region is doped with an N-type dopant material and a majority of said plurality of transistors are PMOS transistors.

11. The method of claim 1, wherein said doped region is doped with a P-type dopant material and said plurality of transistors are comprised of only NMOS transistors.

12. The method of claim 1, wherein said doped region is doped with an N-type dopant material and said plurality of transistors are comprised of only PMOS transistors.

13. A method, comprising:
providing a consumer product comprised of at least one integrated circuit product, said integrated circuit product being comprised of a plurality of doped regions formed in a bulk substrate of an SOI substrate, a plurality of transistors formed above each of said doped regions in an active layer of said SOI substrate and a contact to each of the doped regions;
sensing an operational activity level of said integrated circuit product; and
applying voltage of a magnitude and a polarity to at least one of said doped regions via said contact, said magnitude and polarity of said applied voltage being determined based upon said sensed operational activity level of said integrated circuit product.

14. The method of claim 13, wherein said consumer product comprises one of a personal computer, a portable computer, a mobile telephone, a digital camera, a personal digital assistant or a wireless internet appliance.

15. The method of claim 13, wherein said integrated circuit product is one of a microprocessor, a digital signal process, an application-specific integrated circuit product, a memory array aid or a logic device.

16. The method of claim 13, wherein sensing an operational activity level of said integrated circuit product comprises sensing a rate at which said integrated circuit product is performing its intended functions.

17. The method of claim 13, wherein applying voltage of a magnitude and a polarity to at least one of said doped regions via said contact, said magnitude and polarity of said applied voltage being determined based upon said sensed activity level of said integrated circuit product, comprises applying voltage of a magnitude and a polarity to said at least one doped region via said contact to vary a threshold voltage of at least one of said plurality of transistors formed above said at least one doped region, said magnitude and polarity of said applied voltage being determined based upon said sensed activity level of said integrated circuit product.

18. The method of claim 13, wherein each of said plurality of transistors are comprised of at least one NMOS transistor and at least one PMOS transistor.

19. The method of claim 18, wherein a first of said doped regions is doped with an N-type dopant material and said plurality of transistors formed above said N-doped region are comprised of at least one NMOS transistor and at least one PMOS transistor.

20. The method of claim 18, wherein a first of said doped regions is doped with a P-type dopant material and said plurality of transistors formed above said P-doped region are comprised of at least one NMOS transistor and at least one PMOS transistor.

21. The method of claim 18, wherein at least one of said doped regions is doped with a P-type dopant material and a majority of said plurality of transistors formed above said P-doped region are NMOS transistors.

22. The method of claim 18, wherein at least one of said doped regions is doped with an N-type dopant material and a majority of said plurality of transistors formed above said N-doped region are PMOS transistors.

23. The method of claim 18, wherein at least one of said doped regions is doped with a P-type dopant material and said plurality of transistors formed above said P-doped region are comprised of only NMOS transistors.

24. The method of claim 18, wherein at least one of said doped regions is doped with an N-type dopant material and said plurality of transistors formed above said N-doped region are comprised of only PMOS transistors.

25. The method of claim 18, wherein said plurality of doped regions are comprised of at least one N-doped region and at least one P-doped region.

26. The method of claim 1, wherein said integrated circuit product is a microprocessor and wherein said operational activity level is a number of times said microprocessor is accessed over a certain time period.

27. The method of claim 1, wherein sensing said operational activity level of said integrated circuit product comprises sensing that said integrated circuit product is idle.

28. The method of claim 1, wherein sensing said operational activity level of said integrated circuit product comprises sensing that said integrated circuit product is in use.

29. The method of claim 1, wherein applying said voltage varies a power consumption of said integrated circuit product.

30. The method of claim 1, wherein applying said voltage varies an operating frequency of said integrated circuit product.

31. The method of claim 1, wherein applying said voltage varies a leakage current of said integrated circuit product.

32. The method of claim 13, wherein said integrated circuit product is a microprocessor and wherein said operational activity level is a number of times said microprocessor is accessed over a certain time period.

33. The method of claim 13, wherein sensing said operational activity level of said integrated circuit product comprises sensing that said integrated circuit product is idle.

34. The method of claim 13, wherein sensing said operational activity level of said integrated circuit product comprises sensing that said integrated circuit product is in use.

35. The method of claim 13, wherein applying said voltage varies a power consumption of said integrated circuit product.

36. The method of claim 13, wherein applying said voltage varies an operating frequency of said integrated circuit product.

37. The method of claim 13, wherein applying said voltage varies a leakage current of said integrated circuit product.

* * * * *

UNITED STATES PATENT AND TRADEMARK OFFICE
CERTIFICATE OF CORRECTION

| | | |
|---|---|---|
| PATENT NO. | : 7,335,568 B2 | Page 1 of 1 |
| APPLICATION NO. | : 11/533460 | |
| DATED | : February 26, 2008 | |
| INVENTOR(S) | : Derick J. Wristers, Andy C. Wei and Mark B. Fuselier | |

It is certified that error appears in the above-identified patent and that said Letters Patent is hereby corrected as shown below:

Col. 14, line 41 (claim 15, line 4), delete "aid".

Signed and Sealed this

Seventeenth Day of June, 2008

JON W. DUDAS
*Director of the United States Patent and Trademark Office*